(12) United States Patent
Kukreja et al.

(10) Patent No.: US 8,832,510 B2
(45) Date of Patent: Sep. 9, 2014

(54) CIRCUIT TO REDUCE PEAK POWER DURING TRANSITION FAULT TESTING OF INTEGRATED CIRCUIT

(75) Inventors: Himanshu Kukreja, New Delhi (IN); Deepak Agrawal, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 398 days.

(21) Appl. No.: 13/269,573

(22) Filed: Oct. 8, 2011

(65) Prior Publication Data

US 2013/0091395 A1 Apr. 11, 2013

(51) Int. Cl.
*G01R 31/28* (2006.01)
*G01R 31/3185* (2006.01)

(52) U.S. Cl.
CPC .............. *G01R 31/318594* (2013.01)
USPC ........................................................ 714/729

(58) Field of Classification Search
CPC ............... G01R 31/318547; G01R 31/318536; G01R 31/318575; G01R 31/318555; G01R 31/31721
USPC ........................................................ 714/729
See application file for complete search history.

(56) References Cited

U.S. PATENT DOCUMENTS

| 7,203,876 | B2 | 4/2007 | Allen |
| 7,571,413 | B1* | 8/2009 | Ghosh Dastidar et al. ... 716/136 |
| 2005/0039096 | A1 | 2/2005 | Guettaf |
| 2010/0275077 | A1 | 10/2010 | Rajski |
| 2012/0011410 | A1* | 1/2012 | Whetsel ......................... 714/729 |
| 2012/0030532 | A1* | 2/2012 | Jain et al. ....................... 714/726 |
| 2012/0124423 | A1* | 5/2012 | Chakravadhanula et al. .. 714/27 |

* cited by examiner

*Primary Examiner* — Albert Decady
*Assistant Examiner* — Enam Ahmed
(74) *Attorney, Agent, or Firm* — Charles Bergere

(57) ABSTRACT

A circuit for reducing peak power during transition fault testing of an integrated circuit (IC) includes a programmable register that receives scan shift and SDI (scan data in) signals. Input and output ports of the programmable register are connected together. A multiplexer is provided that has a first input port that is maintained asserted, and a second input port connected to the output port of the programmable register. A scan shift signal, which remains asserted during a scan shift operation and de-asserted during a scan capture operation, is provided at a select input port of the multiplexer. The output of the multiplexer is provided as an input to a clock gating cell. The clock gating cell selectively provides the clock signal to the scan-chain flip-flops in the IC based on the scan shift signal and a functional enable signal, and reduces peak power during transition fault testing.

10 Claims, 5 Drawing Sheets

CIRCUIT TO REDUCE PEAK POWER DURING TRANSITION FAULT TESTING OF INTEGRATED CIRCUIT

BACKGROUND OF THE INVENTION

The present invention relates to testing of integrated circuits, and more particularly, to reducing peak power during transition fault testing of integrated circuits.

Transition fault testing is an important test performed during the design phase of an integrated circuit (IC) and is used to identify and locate signal transition faults. Transition fault testing usually is performed at the rated clock speed to test the response of the IC and is also known as an at-speed test. At-speed tests can be performed as scan tests. Scan tests involve selecting a trace path in the IC for testing. During a scan test, an input signal is provided to a pin in the trace path. The signal then propagates through the trace path and a value of the signal is read at a destination pin. The value is examined to determine if the two pins are properly connected in the trace path.

The test signals used in scan tests may not always adhere to the functional characteristics of the IC. In other words, the test signals may cause the IC to operate in states that are non-functional or not-reachable, resulting in high switching activity. The high switching activity uses high power and requires high peak currents, which in turn lead to excessive voltage or current-resistive (IR) drops. As a result, logic elements in the IC receive less voltage leading to signal propagation delays. The above-mentioned limitations can cause ICs to fail the at-speed scan tests. Also, the power dissipation due to high peak currents may cause permanent damage or hot-spots in the IC. Hence, it is important to keep the switching activity in scan tests close to the switching activity that occurs during the functional operation of the IC.

Many solutions have been proposed to address the problem of high switching caused by scan tests. One solution involves segmenting the IC into scan chains and enabling one scan chain at a time to capture the test response. A scan chain refers to digital logic elements (flip-flops, latches, registers, etc.) that receive the same gated clock signal. Another solution is known as functional scan testing and involves restricting the states of the IC to operational/functional states in a capture cycle. However, identifying the operational states of a large, complex IC is a very difficult task.

Yet another solution that has been proposed to reduce high switching activity is shown in FIG. 1. FIG. 1 is a schematic diagram of a conventional circuit for performing transition fault testing of an integrated circuit (IC) 100. The IC 100 includes a clock gating cell 102 and a scan chain 103. The scan chain 103 includes flip-flops 105 and 107. The clock gating cell 102 is used for gating a clock signal to the flip-flops 105 and 107. The IC 100 may include many such scan chains and clock gating cells. The clock gating cell 102 controls the clock signal to the flip-flops 105 and 107. The clock gating cell 102 includes a test enable (TE) port 109, an enable (E) port 111 and a clock input 113 for receiving the clock signal. Each of the flip-flops 105 and 107 include an input port "D" 115, a scan enable (SE) port 117, a scan data input (SDI) port 119 and a clock input 121 for receiving a clock signal. An output port 122 of the flip-flop 107 is connected to the SDI port 119 of the flip-flop 105. The TE port 109 is connected to the SE port 117 and receives the SE signal, which is also received at the SE port 117 of the flip-flops 105 and 107. An output port "Q" 123 of the clock gating cell 102 is connected to the clock input 121 of the flip-flops 105 and 107.

In launch on capture (LoC) transition tests, the SE signal remains asserted during the scan shift operation and de-asserted during the scan capture operation. The timing diagrams for the SE signal for the scan shift and scan capture operations in LoC transition tests are shown in FIG. 2. In launch on scan (LoS) transition tests, the SE signal remains asserted during the scan shift operation until the end of the first capture cycle and de-asserted during the remaining capture operation. The timing diagrams for the SE signal for the scan shift and scan capture operations in LoS transition tests are shown in FIG. 3.

In an LoC test, the SE signal at the TE port 109 remains asserted (for positive logic, at logic "1") during the scan shift operation and de-asserted during the scan capture operation. During the scan shift operation, when the SE signal at the TE port 109 is high, the clock gating cell 102 provides the clock signal to each of the flip-flops 105 and 107. During the scan capture operation, the SE signal at the TE port remains de-asserted, resulting in the clock gating cell 102 providing the clock signal to the flop-flops 105 and 107 depending on a functional enable signal 125. The functional enable signal 125 is received at the "E" port 111 from functional logic 127. The functional logic 127 is used to enable and disable the clock to the flip-flops 105 and 107 in the functional mode. In scan mode, the functional enable signal 125 from the functional logic 127 is used to control the clock to the flip-flops 105 and 107 during the capture operation. The clock signal is selectively supplied to the flip-flops 105 and 107 depending on the functional enable signal 125. As a result, the peak power of the IC 100 is less than that when there is no clock gating.

However, in an LoS transition test, high peak power still is used by the IC 100. In the LoS transition test, the SE signal at the TE port 109 remains asserted during the scan shift operation and the first cycle of the scan capture operation. The SE signal at the TE port 109 is the same as the SE signal shown in FIG. 3. Since the SE signal at the TE port 109 stays high for the first capture cycle, each of the flip-flops 105 and 107 receives the clock signal, resulting in the IC 100 having high peak power.

Therefore, there is a need for a way to reduce the peak power during transition fault testing (both for LoC and LoS transition tests).

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1:
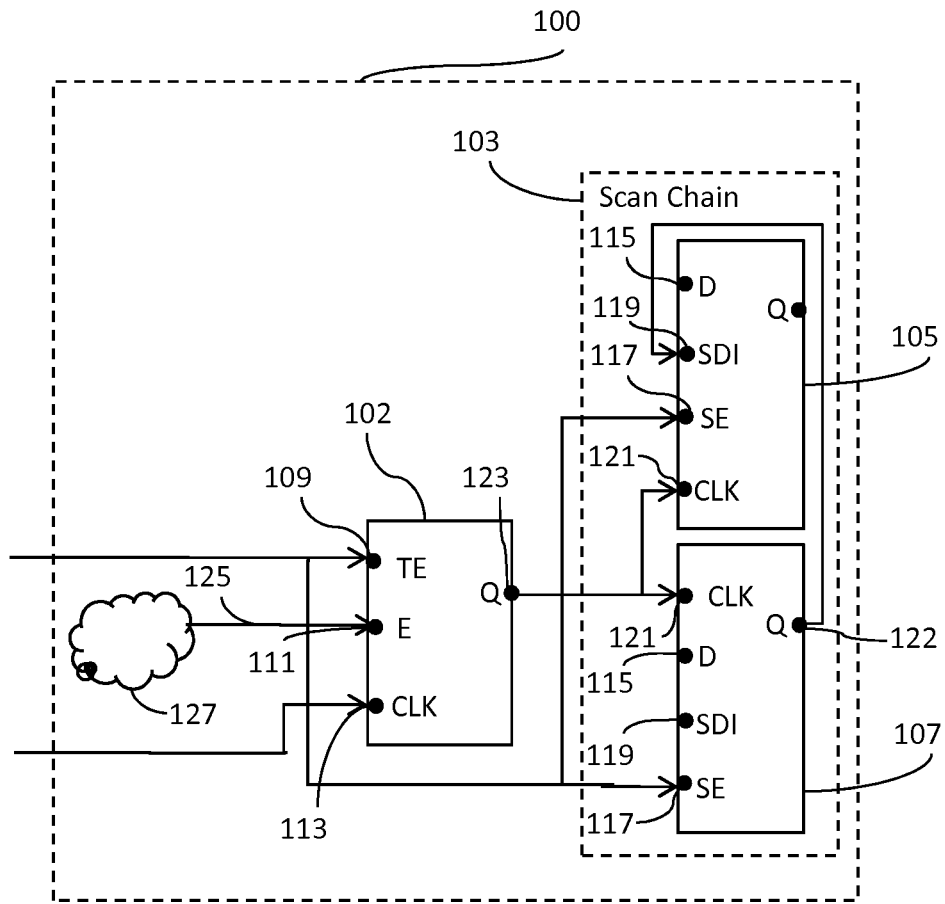
FIG. 1 is a schematic diagram illustrating a conventional circuit used to reduce peak power during transition fault testing of an integrated circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a circuit for reducing peak power during transition fault testing of an integrated circuit is provided. The integrated circuit includes a plurality of flip-flops, a clock gating cell for providing a clock signal to the plurality of flip-flops, and a functional logic for providing a functional enable signal to an enable port of the clock gating cell during a scan capture operation. The circuit includes a programmable register having scan enable (SE) and scan data input (SDI) ports for receiving scan shift and SDI signals respectively. An output port of the programmable register is connected to an input port "D" of the programmable register. The circuit also includes a multiplexer that is connected to the programmable register. The multiplexer includes first and second input ports, a select input port and an output port. The first input port is maintained asserted and the second input port is connected to the output port of the programmable register. The scan shift signal is provided at the select input port. The output port of the multiplexer is connected to a test enable (TE) port of the clock gating cell. The clock gating cell selectively provides the clock signal to the plurality of flip-flops during scan shift and scan capture operations, based on the scan shift and functional enable signals and results in reduced peak power during transition fault testing.

In another embodiment of the present invention, an integrated circuit is provided. The integrated circuit includes a plurality of flip-flops, a clock gating cell for providing a clock signal to the flip-flops, a functional logic for providing a functional enable signal to an enable port of the clock gating cell during a scan capture operation, and a circuit for reducing peak power during transition fault testing of the integrated circuit. The circuit includes a programmable register having SE and SDI ports for receiving scan shift and SDI signals respectively. An output port of the programmable register is connected to an input port "D" of the programmable register. The circuit also includes a multiplexer that is connected to the programmable register. The multiplexer has first and second input ports, a select input port and an output port. The first input port is maintained asserted and the second input port is connected to the output port of the programmable register. The scan shift signal is provided at the select input port. The output port of the multiplexer is connected to a TE port of the clock gating cell. The clock gating cell selectively provides the clock signal to the flip-flops during scan shift operation and scan capture operations, based on the scan shift and functional enable signals and results in reduced peak power during transition fault testing.

In yet another embodiment of the present invention, a method for reducing peak power during transition fault testing of an integrated circuit is provided. The integrated circuit includes a plurality of flip-flops, a clock gating cell for providing a clock signal to the flip-flops, a functional logic for providing a functional enable signal to an enable port of the at least one clock gating cell during a scan capture operation, and a circuit including a programmable register and a multiplexer. Scan shift and SDI signals are provided at scan enable (SE) and SDI ports of the programmable register respectively. An output port of the programmable register is connected to an input port "D". The scan shift signal is provided at a select input port of the multiplexer. A first input port of the multiplexer is maintained at logic "1" and a second input port is connected to the output port of the programmable register. The output port of the multiplexer is connected to a TE port of the clock gating cell. The clock signal is selectively provided to the plurality of flip-flops during scan shift and scan capture operations, based on the scan shift and functional enable signals, resulting in reduced peak power during transition fault testing.

Various embodiments of the present invention provide a system and method to reduce peak power during transition fault testing of an integrated circuit. It will be understood by a person skilled in the art that the various embodiments of the present invention are applicable to both launch on capture (LoC) and launch on scan (LoC) transition tests. The peak power utilized in the embodiments of the present invention is less than that which is utilized by circuits in which the clock signal is transmitted to all flip-flops and in which no clock gating is used. Also, the peak power utilized during LoS transition test is less than that which is utilized by the conventional circuit described in FIG. 1, since the scan shift signal is used as a select signal for the multiplexer and as a SE signal for the programmable register, instead of the conventional SE signal. In other words, the TE port of the clock gating cell is disabled from the first capture cycle of a scan capture operation in an LoS transition test as well and the flip-flops selectively receive the clock signal based on the functional enable signal, resulting in reduced peak power.

Figure 4:
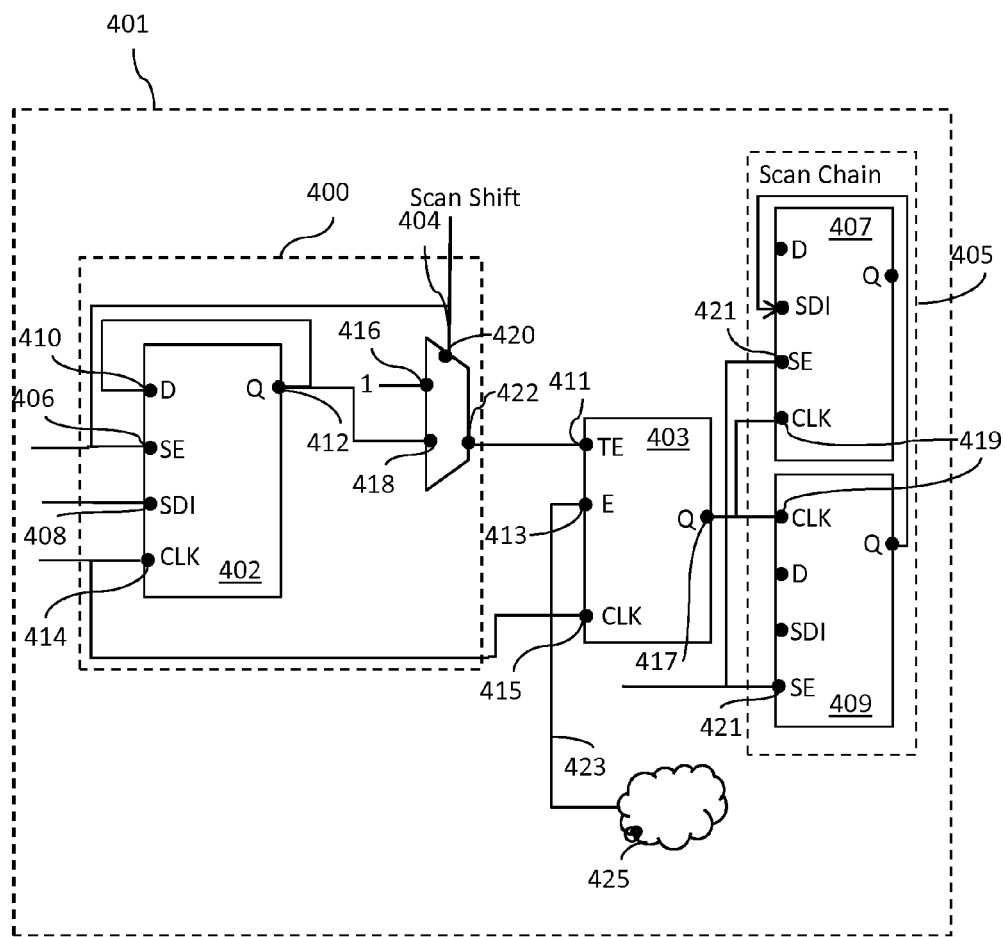
FIG. 4 is a schematic diagram illustrating a circuit used to reduce peak power during transition fault testing of an integrated circuit in accordance with an embodiment of the present invention.

Referring now to FIG. 4, a schematic diagram of a circuit 400 for reducing peak power during transition fault testing of an integrated circuit 401 in accordance with an embodiment of the present invention, is shown. The circuit 400 includes a programmable register 402, and a multiplexer 404. The integrated circuit 401 includes a clock gating cell 403. The clock gating cell 403 is used to provide a clock signal to flip-flops 407 and 409 in the integrated circuit 401. Flip-flops 407 and 409 are part of a scan chain 405. In various embodiments of the present invention, a scan chain refers to a group of digital logic elements connected together (for e.g. flip-flops, latches, data registers, etc.). The integrated circuit 401 may include multiple scan chains and clock gating cells. As shown in FIG. 4, the clock gating cell 403 provides the clock signal to flip-flops 407 and 409. The clock gating cell 403, therefore, controls the clock signal provided to the flip-flops 407 and 409.

The programmable register 402 controls all clock gating cells including the clock gating cell 403 in the integrated circuit 401. The programmable register 402 has an SE port 406 and an SDI port 408 for receiving the SE and SDI signals, respectively, and a clock input 414 for receiving the clock signal. The programmable register 402 further has an input port "D" 410 and an output port 412 that are connected to each other. The output of the programmable register 402 is provided as an input to the multiplexer 404. The programmable register 402 is programmed to generate logic "0" at the output port 412, at the end of each scan shift operation.

The multiplexer 404 has first and second input ports 416 and 418, a select input port 420, and an output port 422. The first input port 416 is maintained asserted (at logic "1"). The output port 412 of the programmable register 402 is connected to the second input port 418. A scan shift signal is input to the select input port 420. The scan shift signal remains asserted (at logic "1") during a scan shift operation and de-asserted (at logic "0") during a scan capture operation in launch on capture (LoC) as well as launch on scan (LoS) transition tests. The scan shift signal is also input to the SE port 406. During a scan shift operation, the scan shift signal is asserted and the multiplexer 404 selects the first input port 416, causing the asserted signal (logic "1") at the first input port 416 to appear at the output port 422. During a scan capture operation, the scan shift signal is de-asserted and the multiplexer 404 selects the signal at the second input port 418 (the output of the programmable register 402), that appears at the output port 422.

Figure 2:
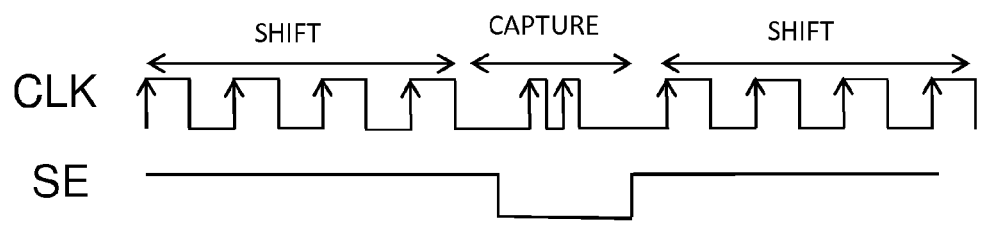
FIG. 2 is a timing diagram of an SE signal during launch of capture (LoC) transition testing of the integrated circuit of FIG. 1.
Figure 3:
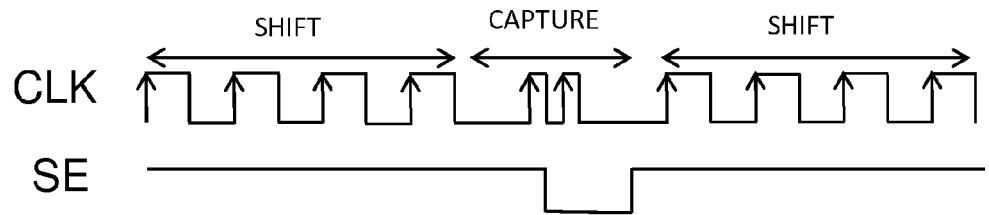
FIG. 3 is a timing diagram of the SE signal during launch of scan (LoS) transition testing of the integrated circuit of FIG. 1.
Figure 5:
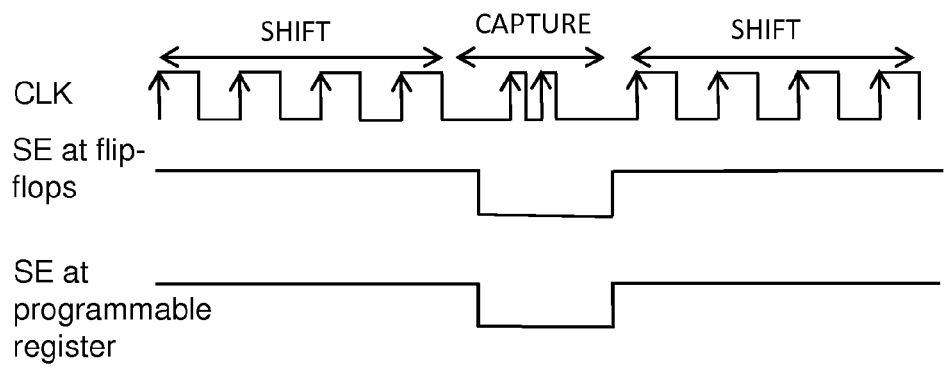
FIG. 5 is a timing diagram of an SE signal at flip-flops in a scan chain and an SE signal at a programmable register during launch of capture (LoC) transition testing of the integrated circuit of FIG. 4.
Figure 6:
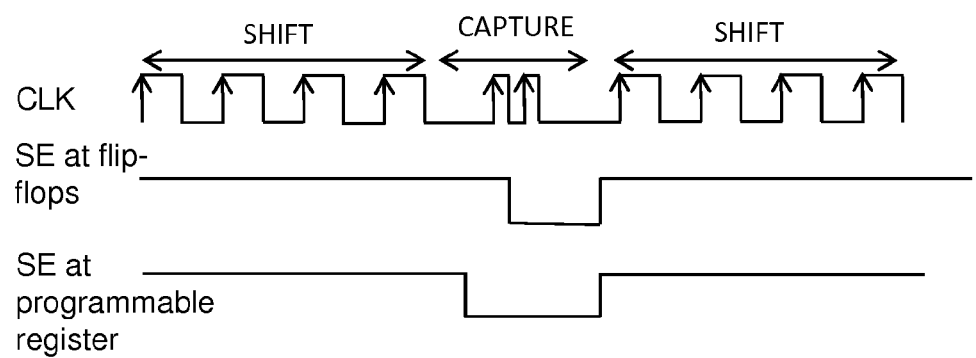
FIG. 6 is a timing diagram of an SE signal at flip-flops in a scan chain and an SE signal at a programmable register during launch of shift (LoS) transition testing of the integrated circuit of FIG. 4.

The output port 422 of the multiplexer 404 is connected to a TE port 411 of the clock gating cell 403. The clock gating cell 403 further has an "E" port 413 for receiving the functional enable signal and a clock input 415 for receiving the clock signal. An output port "Q" 417 of the clock gating cell 403 is connected to corresponding clock inputs 419 of the flip-flops 407 and 409. It is to be noted that the SE signal received at SE ports 421 of the flip-flops 407 and 409 is different from the one received at the SE port 406 of the programmable register 402. The SE signal received at the SE ports 421 is the conventional SE signal that has been explained in conjunction with FIGS. 2 and 3. The SE signal received at SE ports 421 of flip-flops 407 and 409 and the SE signal received at the SE port 406 of the programmable register 402 are shown in FIGS. 5 and 6. FIG. 5 and FIG. 6 are timing diagrams during launch on capture (LoC) and launch on shift (LoS) transition tests, respectively.

In transition fault testing (both LoC and LoS transition tests) of the integrated circuit 401, the scan shift signal is asserted during the scan shift operation that causes the programmable register 402 to transmit the SDI signal from the SDI port 408 to the output port 412. The asserted scan shift signal is also received at the select input port 420 that causes the multiplexer 404 to select the first input port 416 and an asserted signal (logic "1") is transmitted to the output port 422. The asserted signal enables the TE port 411 and the clock signal is provided to both the flip-flops 407 and 409. The programmable register 402 is programmed to logic "0" at the end of the scan shift operation, i.e., the output signal of the programmable register 402 is de-asserted.

During the scan capture operation, the scan shift signal is de-asserted and the programmable register 402 outputs the de-asserted signal to the second input port 418. The de-asserted scan shift signal is also received at the select input port 420 that causes the multiplexer 404 to select the second input port 418. Thus, the de-asserted signal at the second input port 418 is transmitted to the output port 422 that disables the TE port 411. A functional enable signal 423 generated by a functional logic 425 enables the "E" port 413 that causes the clock gating cell 403 to supply the clock signal selectively to the flip-flops 407 and 409, as defined by the functional enable signal 423. The functional logic 425 is used for enabling and disabling the clock to the flip-flops 407 and 409. In other words, the functional enable signal 423 from the functional logic 425 is used to control the enabling of the capture operation on the flip-flops 407 and 409 by supplying the clock signal. When the functional enable signal 423 is asserted, the clock gating cell 403 enables the capture operation on flip-flops 407 and 409 by providing the clock signal. Thus the TE port 411 is disabled from the first scan capture cycle and results in reduced peak power in both the LoC and LoS transition tests.

Figure 7:
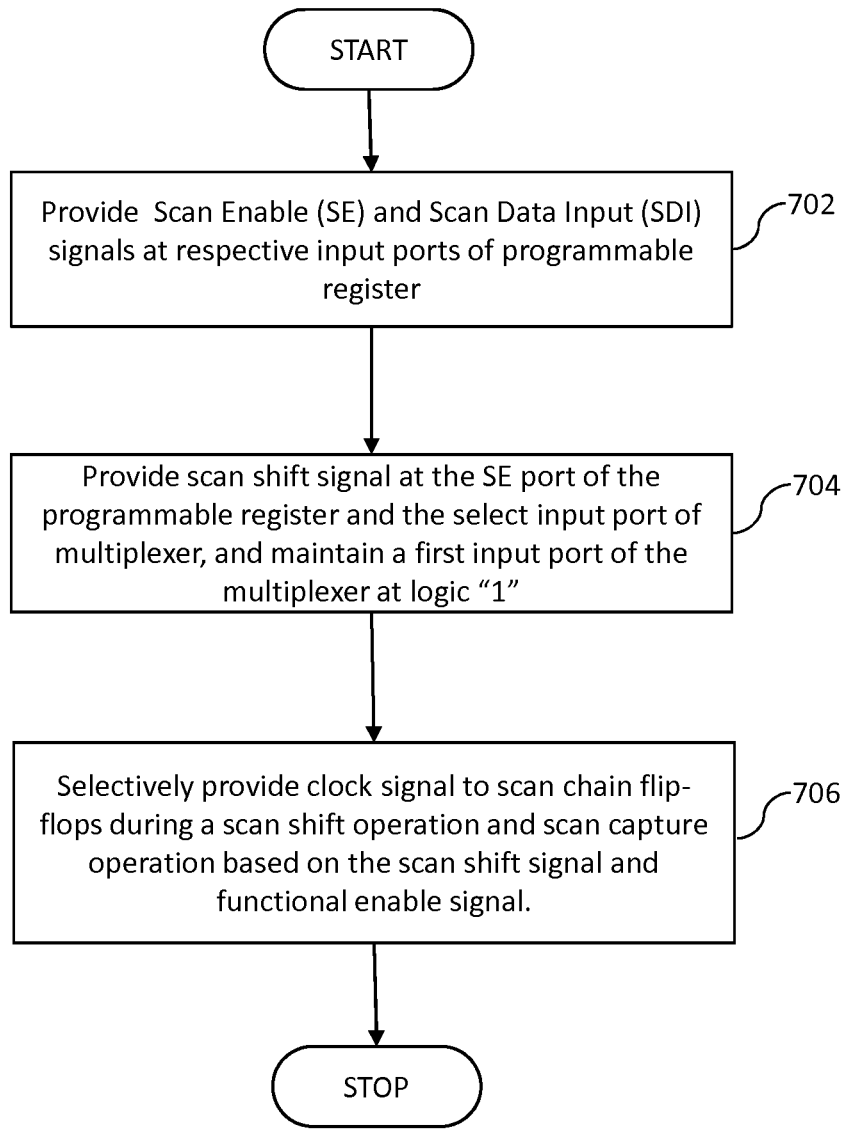
FIG. 7 is a flow diagram illustrating a method for reducing peak power during transition fault testing of an integrated circuit in accordance with an embodiment of the present invention.

Referring now to FIG. 7, a flow diagram illustrating a method for reducing peak power during transition fault testing of the integrated circuit 401 in accordance with an embodiment of the present invention, is shown. Various steps of the flow diagram have been explained in conjunction with FIG. 4. At step 702, the SE and SDI signals are provided to the SE and SDI ports 406 and 408, respectively, of the programmable register 402. At step 704, the scan shift signal is provided to the SE port 406 and the select input port 420 of the multiplexer 404, and the first input port 416 is asserted. At step 706, the clock signal is selectively provided to the flip-flops 407 and 409 during the scan shift and scan capture operations based on the scan shift signal and the functional enable signal 423. During the scan shift operation, the scan shift signal is asserted that causes the multiplexer 404 to transmit an asserted signal (logic "1") from the first input port 416 to the output port 422. The asserted signal is received at the TE port 411 of the clock gating cell 403 and the clock signal is provided to both the flip-flops 407 and 409. Thereafter, the programmable register 402 is programmed to logic "0" at the end of the scan shift operation, i.e., the output signal of the programmable register 402 is de-asserted. During the scan capture operation, the scan shift signal is de-asserted and the programmable register 402 outputs the de-asserted signal to the second input port 418. The de-asserted scan shift signal is received at the select input port 420 that causes the multiplexer 404 to select the second input port 418. Thus the de-asserted signal at the second input port 418 is transmitted to the output port 422 and disables the TE port 411 of the clock gating cell 403. The functional enable signal 423 generated by the functional logic enables the "E" port 413 that causes the clock gating cell 403 to provide the clock signal selectively to the flip-flops 407 and 409, as defined by the functional enable signal 423. Thus the TE port 411 is disabled from the first scan capture cycle and results in reduced peak power in both the LoC and LoS transition tests.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What claimed is:

1. An integrated circuit, comprising:
    a plurality of flip-flops;
    at least one clock gating cell for providing a clock signal to the plurality of flip-flops;
    a functional logic circuit for providing a functional enable signal to an enable port of the at least one clock gating cell during a scan capture operation; and
    a circuit for reducing peak power during transition fault testing of the integrated circuit, wherein the circuit includes,
    a programmable register having scan enable (SE) and scan data input (SDI) ports for receiving scan shift and SDI signals respectively, wherein an output port of the programmable register is connected to an input port "D" of the programmable register; and a multiplexer connected to the programmable register and having first and second input ports, a select input port and an output port, wherein the first input port is maintained asserted, the second input port is connected to the output port of the programmable register, and the scan shift signal is input to the select input port, and wherein the output port of the multiplexer is connected to a Test Enable (TE) port of the at least one clock gating cell, wherein the at least one clock gating cell selectively provides the clock signal to the plurality of flip-flops during a scan shift operation and the scan capture operation, based on the scan shift signal and the functional enable signal, thereby reducing the peak power during the transition fault testing.

2. The integrated circuit of claim 1, wherein the programmable register is programmed to logic "0" at the end of the scan shift operation.

3. The integrated circuit of claim 1, wherein the scan shift signal is asserted during the scan shift operation and de-asserted during the scan capture operation.

4. The integrated circuit of claim 3, wherein the TE port of the at least one clock gating cell is asserted during the scan shift operation, resulting in each of the plurality of flip-flops receiving the clock signal.

5. The integrated circuit of claim 3, wherein the TE port of the at least one clock gating cell is de-asserted during the scan capture operation, resulting in the plurality of flip-flops receiving the clock signal based on the functional enable signal.

6. A method for reducing peak power during transition fault testing of an integrated circuit using at least one clock gating cell for providing a clock signal to the plurality of flip-flops, a functional logic circuit for providing a functional enable signal to an enable port of the at least one clock gating cell during a scan capture operation, and a circuit including a programmable register and a multiplexer, wherein the integrated circuit includes a plurality of flip-flops, the method comprising:

providing scan shift and scan data input (SDI) signals at scan enable (SE) and SDI ports respectively, of the programmable register, wherein an output port of the programmable register is connected to an input port "D" of the programmable register;

providing the scan shift signal at a select input port of the multiplexer, wherein a first input port of the multiplexer is maintained at logic "1", a second input port of the multiplexer is connected to the output port of the programmable register and the output port of the multiplexer is connected to a Test Enable (TE) port of the at least one clock gating cell; and selectively providing the clock signal to the plurality of flip-flops during a scan shift operation and the scan capture operation, based on the scan shift signal and the functional enable signal, thereby reducing the peak power during the transition fault testing.

7. The method of claim 6, further comprising programming the programmable register to logic "0" at the end of the scan shift operation.

8. The method of claim 6, further comprising asserting the scan shift signal during the scan shift operation and de-asserting the scan shift signal during the scan capture operation.

9. The method of claim 8, further comprising asserting the TE port of the at least one clock gating cell during the scan shift operation, resulting in each of the plurality of flip-flops receiving the clock signal.

10. The method of claim 8, further comprising de-asserting the TE port of each clock gating cell during the scan capture operation, resulting in the plurality of flip-flops receiving the clock signal based on the functional enable signal.

* * * * *